United States Patent
Tran et al.

(10) Patent No.: US 11,211,107 B1
(45) Date of Patent: Dec. 28, 2021

(54) MAGNETIC MEMORY READ CIRCUIT AND CALIBRATION METHOD THEREFOR

(71) Applicant: Avalanche Technology, Inc., Fremont, CA (US)

(72) Inventors: Thinh Tran, Palo Alto, CA (US); Ebrahim Abedifard, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 17/031,542

(22) Filed: Sep. 24, 2020

Related U.S. Application Data

(60) Provisional application No. 63/073,370, filed on Sep. 1, 2020.

(51) Int. Cl.
   *G11C 11/16* (2006.01)

(52) U.S. Cl.
   CPC ...... *G11C 11/1673* (2013.01); *G11C 11/1659* (2013.01)

(58) Field of Classification Search
   None
   See application file for complete search history.

(56) References Cited

U.S. PATENT DOCUMENTS

| | | | |
|---|---|---|---|
| 7,239,537 B2 * | 7/2007 | DeBrosse | G11C 29/02 365/154 |
| 7,813,166 B2 * | 10/2010 | Jung | G11C 11/1673 365/158 |
| 8,213,215 B2 | 7/2012 | Chen et al. | |
| 9,384,791 B1 | 7/2016 | Chan et al. | |
| 9,437,257 B2 | 9/2016 | Yang et al. | |
| 10,311,919 B2 | 6/2019 | Schippers | |
| 10,453,532 B1 | 10/2019 | Antonyan | |
| 10,622,066 B2 | 4/2020 | Antonyan | |
| 2004/0240255 A1 * | 12/2004 | Smith | G11C 29/026 365/158 |
| 2010/0073069 A1 | 3/2010 | Wang et al. | |
| 2014/0321195 A1 * | 10/2014 | Antonyan | G11C 11/1675 365/148 |
| 2018/0137913 A1 * | 5/2018 | Kim | G11C 13/004 |
| 2019/0043590 A1 | 2/2019 | Besinga et al. | |
| 2019/0088322 A1 * | 3/2019 | Pyo | G11C 11/1673 |
| 2019/0348096 A1 | 11/2019 | Antonyan et al. | |
| 2020/0090724 A1 | 3/2020 | Antonyan et al. | |
| 2020/0194068 A1 | 6/2020 | Antonyan | |

\* cited by examiner

*Primary Examiner* — J. H. Hur
(74) *Attorney, Agent, or Firm* — Bing K. Yen

(57) ABSTRACT

The present invention is directed to a nonvolatile memory device that includes a plurality of memory slices, each memory slice including one or more memory sectors and a read circuit for sensing the resistance state of a magnetic memory cell in the memory sectors. The read circuit includes first and second input nodes; a sense amplifier having first and second input terminals; a first target resistor and a balancing resistor connected in series between the first input node and the first input terminal; a multiplexer having a first input, a second input, and an output, with the first input being connected to the second input node and the output being connected to the second input terminal; a second target resistor and an offset resistor connected in series between the second input node and the second input; and first and second current sources connected to the first and second input terminals, respectively.

23 Claims, 11 Drawing Sheets

US 11,211,107 B1

MAGNETIC MEMORY READ CIRCUIT AND CALIBRATION METHOD THEREFOR

CROSS-REFERENCE TO RELATED APPLICATIONS

The present application claims priority to provisional application No. 63/073,370, filed on Sep. 1, 2020.

BACKGROUND

The present invention relates to a nonvolatile memory, and more particularly, to embodiments of sensing circuitry for the nonvolatile memory and method for using the same.

A resistance-switching memory device normally comprises an array of memory cells, each of which includes a memory element and a selection element, such as access transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram for a conventional memory array 20, which comprises a plurality of memory cells 22 arranged in rows and columns with each of the memory cells 22 including an access transistor 24 coupled to a resistance-switching memory element 26; a plurality of parallel word lines 28 with each being coupled to the gates of a respective row of the access transistors 24 in a first direction; a plurality of parallel bit lines 30 with each being coupled to a respective column of the memory elements 26 in a second direction substantially perpendicular to the first direction; and a plurality of parallel source lines 32 with each being coupled to a respective row or column of the access transistors 24 in the first or second direction.

The resistance-switching memory element 26 may be classified into at least one of several known groups based on their resistance-switching mechanisms. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal-rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current to the MTJ, the magnetization direction of the magnetic free layer can be switched between two configurations: parallel (i.e., same direction) and antiparallel (i.e., opposite direction) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially antiparallel or oriented in opposite directions. The stored logic in the magnetic memory element can be switched by changing the magnetization direction of the magnetic free layer between parallel and antiparallel configurations with respect to the magnetization direction of the reference layer. Therefore, the two stable resistance states enable the MTJ to serve as a nonvolatile memory element.

MRAM devices have almost unlimited read/write endurance but relatively smaller sensing margin compared with other types of resistance-switching memory devices, such as phase change random access memory (PCRAM) and resistive random access memory (ReRAM). The resistance ratio of high-to-low resistance state of MRAM is about 2-3, compared with $10^1$-$10^5$ for PCRAM and ReRAM.

FIG. 2 is a plot showing the resistance distributions 40 and 42 respectively corresponding to the low and high resistance states of an MTJ population. The x-axis represents the electrical resistance while the y-axis represents the number of MTJs having a particular electrical resistance. An MTJ having a resistance that falls within the $R_L$ distribution 40 is considered to be in the low resistance ($R_L$) state. Likewise, an MTJ having a resistance that falls within the $R_H$ distribution 42 is considered to be in the high resistance ($R_H$) state. The resistance state of the MTJ may be determined during a read operation by comparing the resistance of the MTJ with a reference resistance ($R_{REF}$) that is somewhere in between the $R_L$ distribution 40 and the $R_H$ distribution 42. One way to establish $R_{REF}$ is to simply take the average of the mean of $R_L$ distribution and the mean of $R_H$ distribution as shown in the plot. While being relatively simple, this method results in reduced sensing margin for the high resistance state because of the inherently broader distribution thereof. Another way to select $R_{REF}$ is to choose the midpoint in the gap between the $R_L$ and $R_H$ distributions 40 and 42 (e.g., the average of $R_L$ mean+3σ and $R_H$ mean−3σ) as shown. Compared with the former method, the latter method improves the sensing margin for the high resistance state at room temperature, but suffers the same problem at elevated temperatures as the resistance of MTJ decreases.

For the foregoing reasons, there is a need for a circuit and a method for improving the sensing margin of MRAM.

SUMMARY

The present invention is directed to a nonvolatile memory device comprising a plurality of memory slices, each memory slice including one or more memory sectors and a read circuit for sensing the resistance state of a magnetic memory cell in the one or more memory sectors. The read circuit comprises a first input node through which a reference current passes; a second input node through which a read current and a calibration current from the one or more memory sectors pass; a sense amplifier having first and second input terminals; a first target resistor and a balancing resistor connected in series between the first input node and the first input terminal of the sense amplifier; a first current source connected to the first input terminal of the sense amplifier at one end and ground at the other end; a multiplexer having a first input terminal, a second input terminal, and an output terminal, with the first input terminal of the multiplexer being connected to the second input node and having the substantially same potential as the second input node and the output terminal of the multiplexer being connected to the second input terminal of the sense amplifier; a second target resistor and an offset resistor connected in series between the second input node and the second input terminal of the multiplexer; and a second current source connected to the output terminal of the multiplexer at one end and ground at the other end. The first and second target resistors are variable resistors and have the substantially same resistance value.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention, except where the context excludes that possibility.

Figure 3:
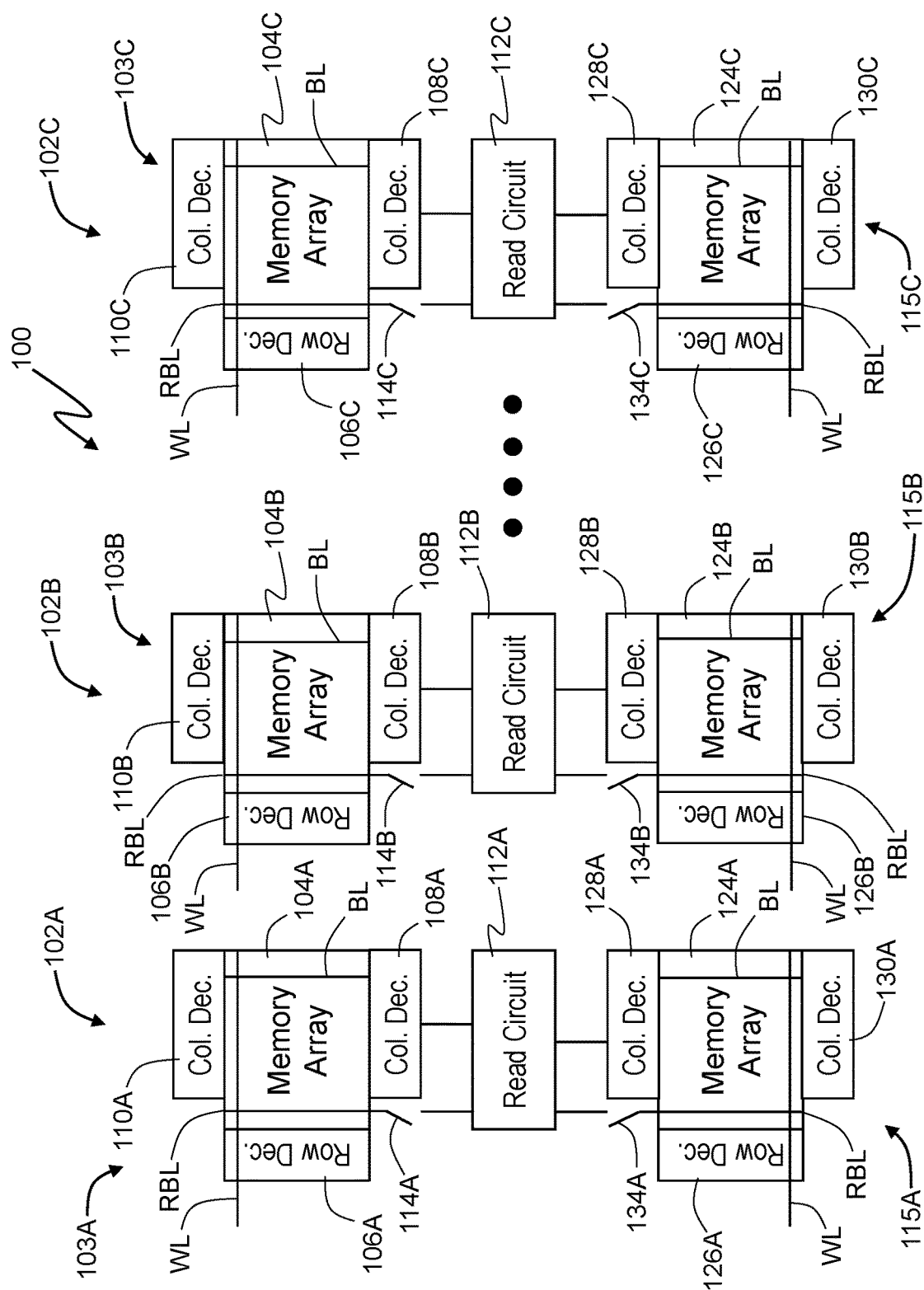
FIG. 3 is a block diagram illustrating components of a memory device in accordance with an exemplary embodiment of the present invention.

FIG. 3 is a block diagram illustrating components of a memory device 100 in accordance with an exemplary embodiment of the present invention. The memory device 100 includes a plurality of I/O or memory slices represented by memory slices 102A-102C. Each of the memory slices 102A-102C has independent input/output from other slices and may include one or two memory sectors. Each memory slice (e.g., 102A) may include a first memory sector (e.g., 103A) and a read circuit (e.g., 112A) connected thereto. The first memory sector 103A includes a first memory array 104A, a first row decoder 106A for selecting one of word lines (WLs) traversing the first memory array 104A along a first direction, a first column decoder 108A for selecting a bit line (BL) traversing the first memory array 104A along a second direction substantially perpendicular to the first direction, and a second column decoder 110A for selecting a source line (not shown) traversing the memory array 104A along the second direction. The read circuit 112A is connected to the output of the first column decoder 108A.

Figure 1:
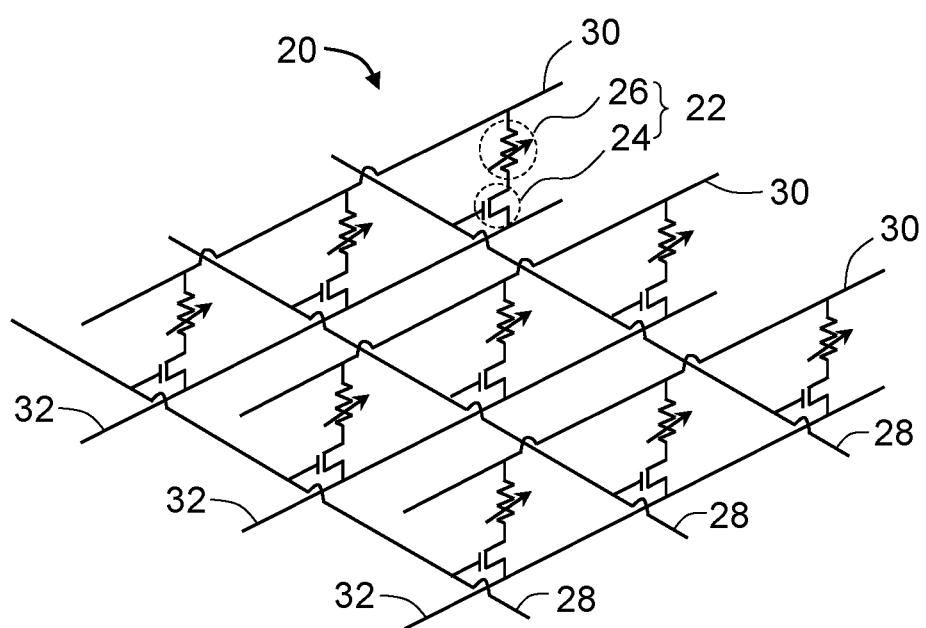
FIG. 1 is a schematic circuit diagram for an array of memory cells with each memory cell including a resistance-switching memory element and an access transistor coupled in series between a bit line and a source line.

The first memory array 104A is analogous to the memory array 20 shown in FIG. 1 and includes a plurality of memory cells arranged in rows and columns (not shown), a plurality of parallel word lines (WLs), a plurality of parallel bit lines (BLs), and a plurality of parallel source lines (not shown). The first memory array 104A may also include a reference bit line (RBL) connected to the read circuit 112A through a first switch 114A. The reference bit line (RBL) may provide a reference signal or current to the read circuit 112A when determining the resistance state of a memory cell in the memory array 104A.

Each memory slice (e.g., 102A) may further include a second memory sector (e.g., 115A) connected to the read circuit (e.g., 112A). The second memory sector 115A includes a second memory array 124A, a second row decoder 126A for selecting a word line (WL) traversing the second memory array 124A along the first direction, a third column decoder 128A for selecting a bit line (BL) traversing the second memory array 124A along the second direction substantially perpendicular to the first direction, and a fourth column decoder 130A for selecting a source line (not shown) traversing the memory array 124A along the second direction. The second memory array 124A may also include a reference bit line (RBL) connected to the read circuit 112A through a second switch 134A. The first and second memory sectors 103A and 115A may be physically arranged in a mirror-image geometry on opposite sides of the read circuit 112A that acts as the mirror line.

Figure 4:
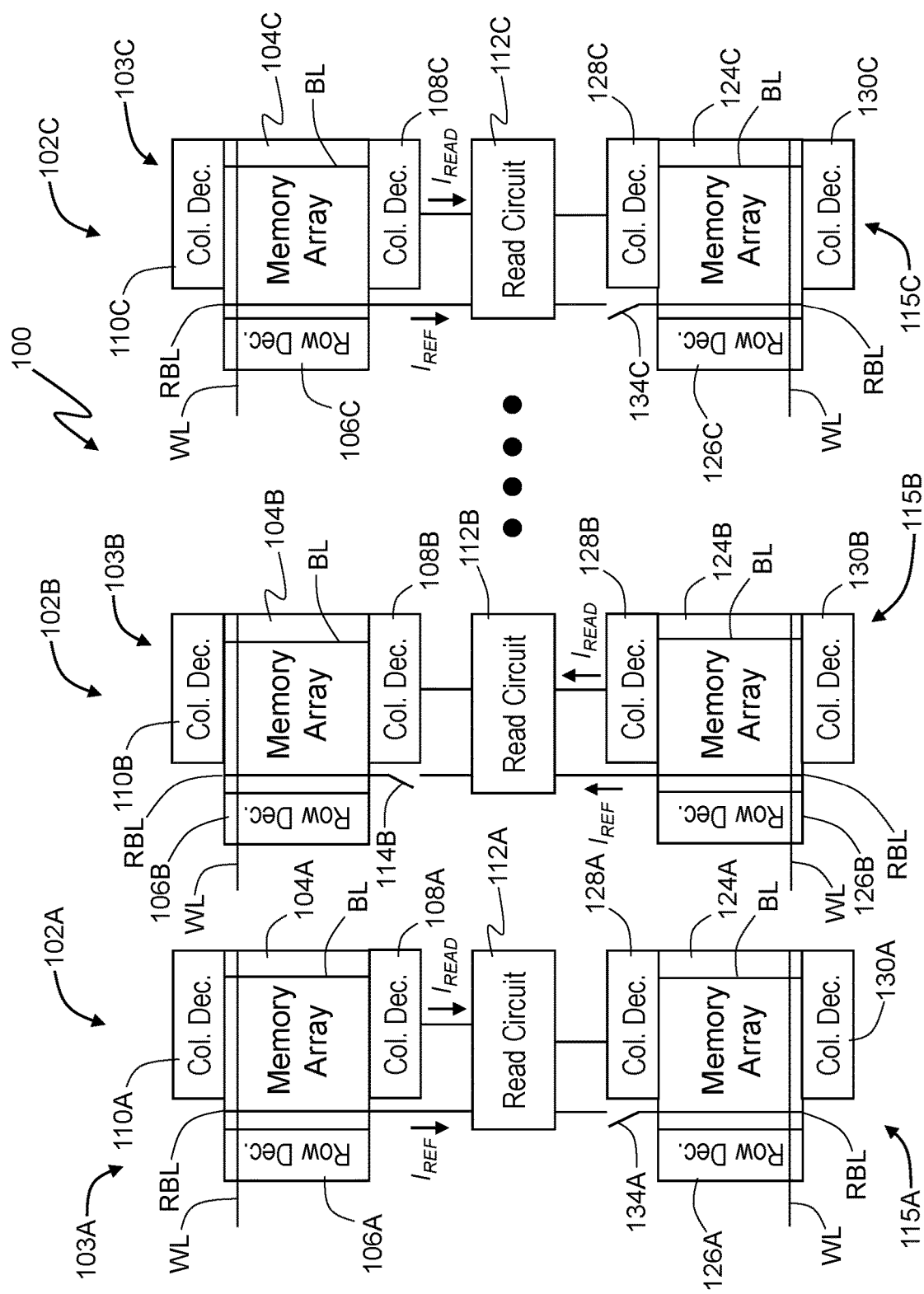
FIG. 4 is a diagram illustrating an example of the read and reference current paths for the memory device of FIG. 3 in a read operation.

Since each of the memory slices 102A-102C includes a respective one of the read circuits 112A-112C, a memory cell from each of the memory slices 102A-102C may be independently sensed at the same time. For example and without limitation, FIG. 4 shows that a memory cell from the first memory sector 103A of the first memory slice 102A, another memory cell from the second memory sector 115B of the second memory slice 102B, and still another memory cell from the first memory sector 103C of the last memory slice 102C are simultaneously sensed. During the sensing or read operation, the read current, $I_{READ}$, passes through the memory cell selected for the read operation, the bit line connected thereto, and reaches the read circuit via the first or third column decoder, while the reference current ($I_{REF}$) passes through the reference bit line (RBL) to reach the read circuit via the first or second switch.

Figure 5:
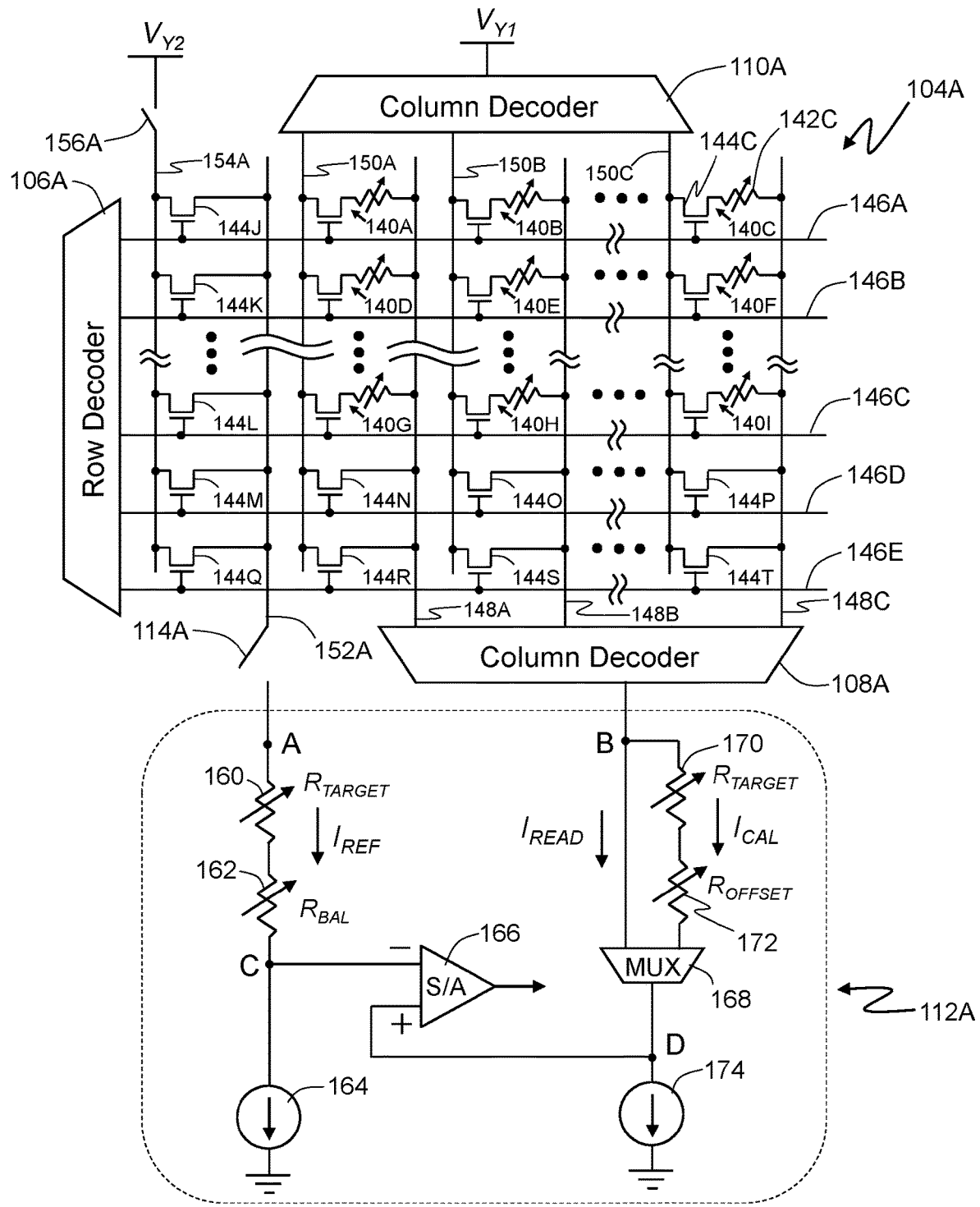
FIG. 5 is a schematic circuit diagram for a memory section and a read circuit of the memory device of FIG. 3.

FIG. 5 is schematic circuit diagram showing the first memory sector 103A and the read circuit 112A of the first memory slice 102A. The first memory sector 103A includes the first memory array 104A, the first row decoder 106A, the first and second column decoders 108A and 110A, and the first switch 114A. The first memory array 104A includes a plurality of memory cells arranged in rows and columns as represented by cells 140A-140I, a plurality of word lines represented by lines 146A-146C, a plurality of bit lines represented by lines 148A-148C, and a plurality of source lines represented by lines 150A-150C. Each memory cell (e.g., 140C) includes a resistance-switching memory element (e.g., 142C) and an access transistor (e.g., 144C) coupled in series between a respective one of the bit lines (e.g., 148C) and a respective one of the source lines (e.g., 150C). Each of the plurality of word lines 146A-146C is coupled to the gates of a respective row of the access transistors in a first direction. Each of the plurality of bit lines 148A-148C is coupled to a respective column of the memory cells 140A-140I at one end thereof (e.g., memory element) along a second direction. Each of the plurality of source lines 150A-150C is coupled to a respective column of the memory cells 140A-140I at the other end thereof (e.g., access transistor) along the second direction. The first and second directions may be substantially orthogonal to each other. The positions of the resistance-switching memory element (e.g., 142C) and the access transistor (e.g., 144C) in a memory cell (e.g., 140C) may be swapped such that the memory element (e.g., 142C) and the access transistor (e.g., 144C) are disposed adjacent to the source line (e.g., 150C) and the bit line (e.g., 148C), respectively.

Each of the resistance-switching memory elements (e.g., 142C) may change the resistance state thereof by any suitable switching mechanism, such as but not limited to phase change, precipitate bridging, magnetoresistive switching, or any combination thereof. In one embodiment, the memory element 142C comprises a phase change chalcogenide compound, such as but not limited to $Ge_2Sb_2Te_5$ or AgInSbTe, which can switch between a resistive phase and a conductive phase. In another embodiment, the memory element 142C comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory element 142C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The first memory array 104A further includes a column of access transistors 144J-144L with the gate of each access transistor coupled to a respective one of the word lines 146A-146C. The column of access transistors 144J-144L, which are used to control the reference current during sensing, can be regarded as "dummy" cells without memory elements. The column of access transistors 144J-144L are coupled to a reference bit line 152A at one of the source and drain and to a reference source line 154A at the other one of the source and drain. The first memory array 104A may further include one or more rows of access transistors 144M-144T connected to one or more word lines 146D and 146E at the gates thereof. Each transistor of the rows of the access transistors 144M-144T is connected to a respective one of the bit lines 148A-148C or the reference bit line 152A at one of the source and drain and to a respective one of the source lines 150A-150C or the reference source line 154A at the other one of the source and drain.

All of the word lines 146A-146E may be connected to the row decoder 106A, which allows one the word line 146A-146E to be selected for read or write operation. A voltage ($V_{Y1}$) may be applied to one of the source lines 150A-150C via the second column decoder 110A connected thereto during the read or write operation. Similarly, another voltage (e.g., $V_{Y2}$) may be applied to the reference source line 154A through a third switch 156A. In an embodiment, the voltages $V_{Y1}$ and $V_{Y2}$ are set to the same voltage ($V_{READ}$) during the read operation and the calibration of the read circuit 112A. The first column decoder 108A connected to the bit lines 148A-148C allows one of the bit lines 148A-148C to be connected to Node B of the read circuit 112A. Likewise, the reference bit line 152A may be connected to Node A of the read circuit 112A via the first switch 114A.

The read circuit 112A includes two input terminals at Nodes A and B, a first target resistor ($R_{TARGET}$) 160 and a balancing resistor ($R_{BAL}$) 162 connected in series between Nodes A and C, a first current source 164 connected to Node C at one end and ground at the other end, a multiplexer (MUX) 168 with one of the two inputs connected to Node B, a second target resistor ($R_{TARGET}$) 170 and an optional offset resistor ($R_{OFFSET}$) 172 connected in series between Node B and the other one of the two inputs of the multiplexer (MUX) 168, whose output is connected to Node D, a second current source 174 connected to Node D at one end and ground at the other end, and a sense amplifier 166 with one input (e.g., negative terminal) connected to Node C and the other input (e.g., positive terminal) connected to Node D. The first and second target resistors 160 and 170 are variable resistors having same design specifications. However, the actual resistances of the resistors 160 and 170 may be different owing to manufacturing variation. The balancing resistor ($R_{BAL}$) 162 and the optional offset resistor ($R_{OFFSET}$) 172 may also be variable resistors.

During calibration of the read circuit 112A, the word line 146D connected to the row of transistors 144M-144P may be selected via the row decoder 106A to allow the reference current ($I_{REF}$) to flow from the reference source line 154A with the voltage $V_{READ}$ applied thereto, through the access transistor 144M, the reference bit line 152A, and the first switch 144A, to the input terminal Node A of the read circuit 112A. From Node A, the reference current ($I_{REF}$) passes through the first target resistor ($R_{TARGET}$) 160, the balancing resistor ($R_{BAL}$) 162, and the first current source 164, and to ground.

The selection of the word line 146D during calibration also enables the calibration current ($I_{CAL}$) to flow from one of the source lines 150A-150C (e.g., 150C) selected through the second column decoder 110A and having the applied voltage of $V_{READ}$, through a respective one of the access transistors 144N-144P (e.g., 144P), a respective one of the bit lines 148A-148C (e.g., 148C), and the first column decoder 108A, to the input terminal Node B of the read circuit 112A. From Node B, the calibration current ($I_{CAL}$) flows through the second target resistor ($R_{TARGET}$) 170, the optional offset resistor ($R_{OFFSET}$) 172 if present, the multiplexer (MUX) 168, the second current source 174, and to ground. The sense amplifier 166 measures the voltage differential at Nodes C and D along the reference current path and the calibration current path, respectively. Neither the reference current ($I_{REF}$) nor the calibration current ($I_{CAL}$) passes through any of the memory cells 140A-140I containing the memory elements.

In the read operation, a memory cell (e.g., 140C) is selected for sensing by selecting the word line (e.g., 146A) connected thereto. The source line 150C connected to the selected memory cell 140C is selected by the second column decoder 110A and may have a potential of $V_{READ}$. The bit line 148C connected to the selected memory cell 140C is selected by the first column decoder 108A, thereby allowing the read current (TREAD) to flow from the source line 150C, through the access transistor 144C, the memory element 142C, the bit line 148C, and the first column decoder 108A, to Node B of the read circuit 112A. From Node B, the read current (TREAD) passes the multiplexer (MUX) 168, Node D, the second current source 174, and to ground, bypassing the second target resistor ($R_{TARGET}$) 170 and the optional offset resistor ($R_{OFFSET}$) 172. The multiplexer (MUX) 168 is used to select different current paths during the read and calibration operations.

The selection of the word line 146A during the read operation and activation of the first and third switches 114A and 156A allows the reference current ($I_{REF}$) to flow from the reference source line 154A, which may have a potential of $V_{READ}$ applied thereto, through the access transistor 144J, the reference bit line 152A, and the first switch 114A, to Node A of the read circuit 112A. From Node A, the reference current ($I_{REF}$) passes through the first target resistor ($R_{TARGET}$) 160, the balancing resistor ($R_{BAL}$) 162, Node C, and the first current source 164, and to ground.

The sense amplifier 166 measures the voltage differential between Nodes C and D along the reference current path and the read current path, respectively. The first target resistor ($R_{TARGET}$) 160 and the balancing resistor ($R_{BAL}$) 162 collectively function as the reference resistor, whose resistance is ideally somewhere in between the low and high resistances of the memory element 142C. When the memory element 142C is in the low resistance state, the voltage drop across the memory element 142C may be less than the voltage drop across the first target resistor ($R_{TARGET}$) 160 and the balancing resistor ($R_{BAL}$) 162, resulting in the voltage of Node D being higher than that of Node C. Conversely, the voltage drop across the memory element 142C may be greater than the voltage drop across the first target resistor ($R_{TARGET}$) 160 and the balancing resistor ($R_{BAL}$) 162 when the memory element 142C is in the high resistance state, resulting in the voltage of Node D being lower than that of Node C.

Figure 2:
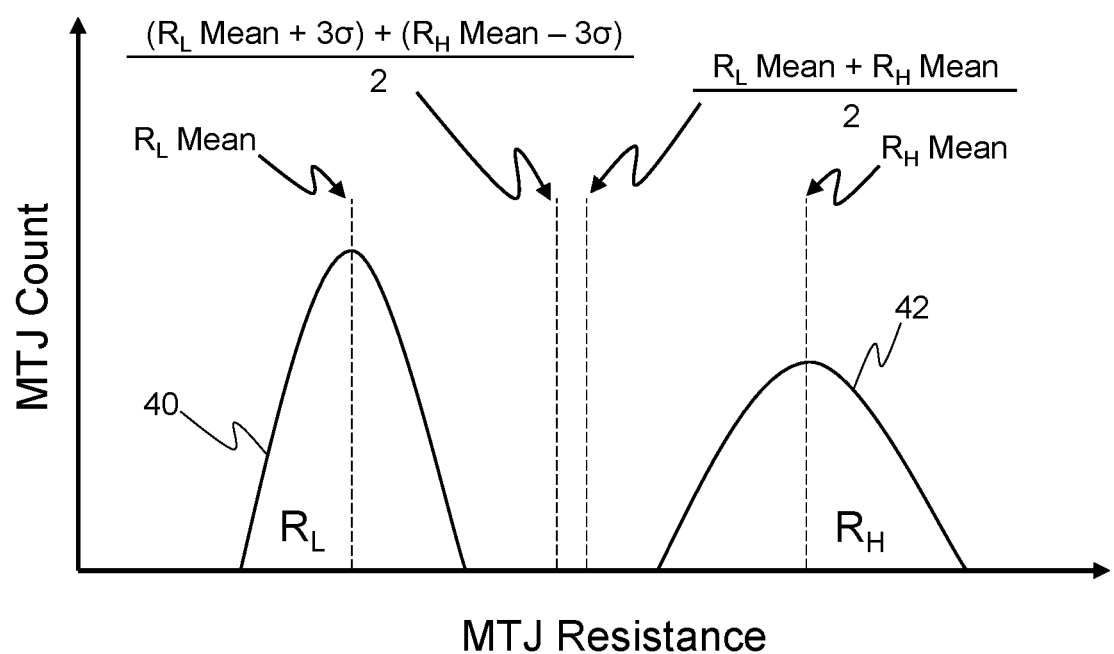
FIG. 2 is a plot showing low and high resistance distributions for a sample population of magnetic tunnel junctions (MTJs)

Knowing the low and high resistance distributions 40 and 42 corresponding to the memory elements of the memory array 104A as shown in FIG. 2, the reference resistance ($R_{REF}$), which is collectively provided by the first target resistor ($R_{TARGET}$) 160 and the balancing resistor ($R_{BAL}$) 162, may be simply set to a value somewhere in between the $R_L$ distribution 40 and the $R_H$ distribution 42 in an ideal situation. However, the potential mismatch of the sense amplifier 166 at the input terminals (i.e., Nodes C and D), which may be caused by the differences between the read and reference current paths and the deviation from design specifications of components caused by manufacturing, including the sense amplifier 166 itself, can cause a bias in the sensing process.

Accordingly, the read circuit 112A may be calibrated prior to usage to correct any potential sensing bias caused by the above cited factors. Calibration of the read circuit 112A will now be described with reference to FIG. 5. The calibration process begins by setting the resistance of the first and second target resistors ($R_{TARGET}$) 160 and 170 to an initial value (e.g., approximately middle of the resistance range of $R_{TARGET}$ or a value somewhere in between the $R_L$ and $R_H$ distributions) and setting the resistance of the balancing resistor ($R_{BAL}$) 162 to another value (e.g., minimum value or zero). The resistance of the offset resistor ($R_{OFFSET}$) 172 is then set to a value that renders the resistance of the calibration current path to be higher than that of the reference current path (i.e., Node D having a lower potential than Node C). The offset resistor ($R_{OFFSET}$) 172 is needed especially when the calibration current path has a lower resistance than the reference current path.

When the reference current ($I_{REF}$) and the calibration current ($I_{CAL}$) initially flow through the read circuit 112A, one of the inputs (e.g., positive terminal) of the sense amplifier 166 connected to Node D will be at a lower potential than the other input (e.g., negative terminal) connected to Node C because the calibration current path initially has a higher resistance, thereby causing the sense amplifier 166 to output a signal (e.g., "0"). As the calibration process continues by gradually increasing the resistance of the balancing resistor ($R_{BAL}$) 162 from its initial setting, the output of the sense amplifier 166 will eventually flip to the opposite signal (e.g., "1") when the resistances of the reference and calibration current paths are substantially balanced. The resistance of the balancing resistor ($R_{BAL}$) 162 may therefore be fixed at or near the point where the output signal of the sense amplifier 166 flips.

Figure 6:
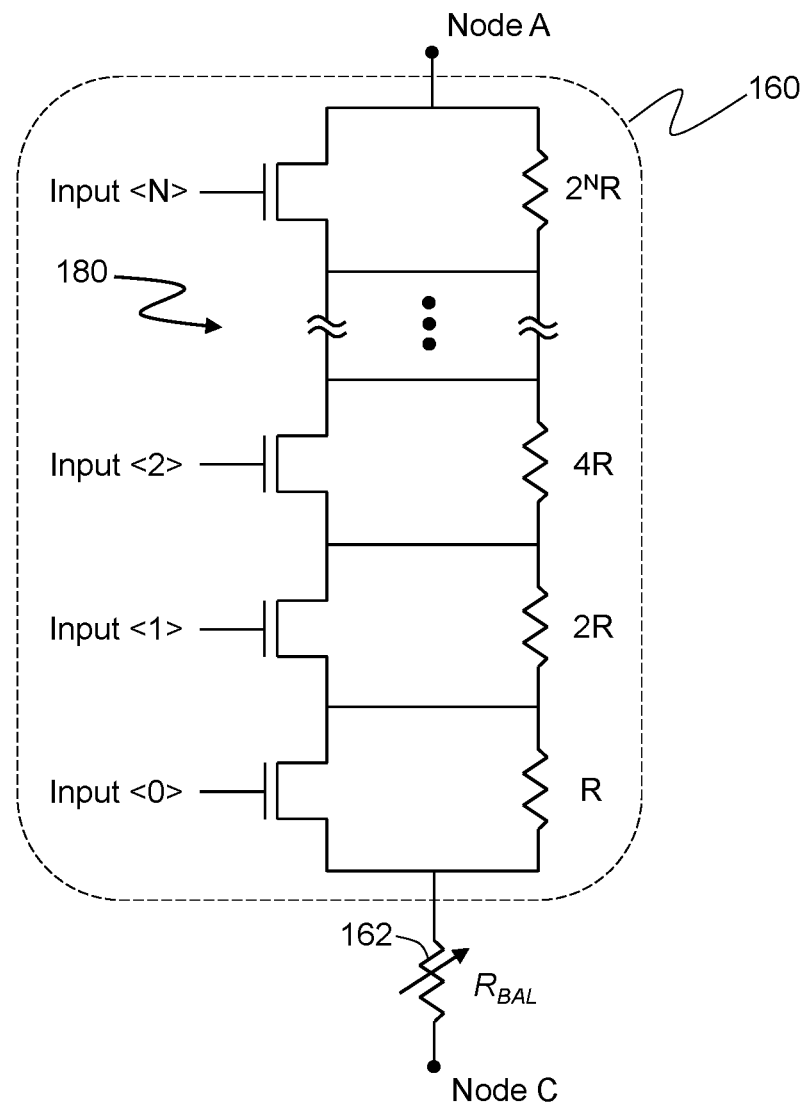
FIG. 6 is a schematic circuit diagram for an exemplary variable resistance circuit used for the first and second target resistors in the read circuit shown in FIG. 5.

After fixing the resistance of the balancing resistor ($R_{BAL}$) 162, the calibration process may further proceed by adjusting the resistance of the first target resistor ($R_{TARGET}$) 160 such that the reference resistance ($R_{REF}$) falls in between the $R_L$ distribution 40 and the $R_H$ distribution 42 as shown in FIG. 2. FIG. 6 is a schematic circuit diagram for the first target resistor ($R_{TARGET}$) 160 in accordance with an embodiment of the present invention. The first target resistor ($R_{TARGET}$) 160 may include a variable resistance circuit 180 that comprises N+1 number of sub-circuits connected in series. Each sub-circuit includes a transistor and a resistor with fixed resistance connected in parallel. The resistance of the resistor in the sub-circuit doubles in the successive sub-circuit in the sequence the sub-circuits, such that the last sub-circuit in the series includes a resistor having a resistance of $2^N R$, where R represents the resistance of the resistor in the first sub-circuit of the sequence of sub-circuits and the minimum incremental adjustment in the resistance of the variable resistance circuit 180. The resistance of the first target resistor ($R_{TARGET}$) 160 may be adjusted by N+1 input signals (i.e., Input <0> to Input <N>) to the transistors of the respective sub-circuits, which collectively provide a nominal resistance range of 0 to $(2^{N+1}-1)R$. The nominal resistance of the first target resistor ($R_{TARGET}$) 160 becomes 0 and $(2^{N+1}-1)/R$ when all input signals (i.e., Input <0> to Input <N>) are set to "1" and "0", respectively. During calibration of the balancing resistor ($R_{BAL}$) as described above, the resistance of the first and second target resistors ($R_{TARGET}$) 160 and 170 may be set to approximately half of their maximum by setting the last input signal (i.e., Input <N>) to "0" while setting the rest of the input signals (i.e., Input <0> to Input <N–1>) to "1".

Figure 7:
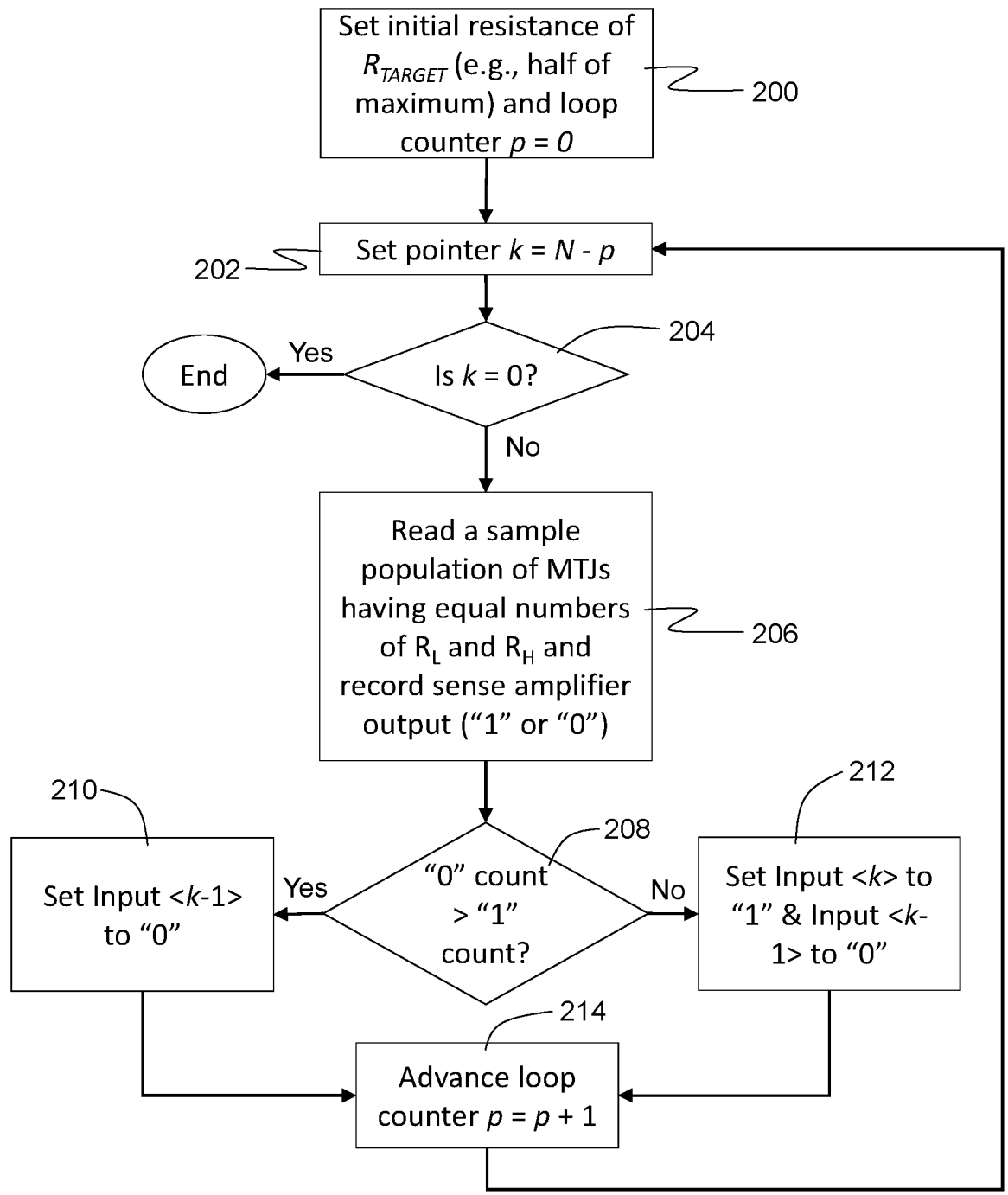
FIG. 7 is a flow diagram illustrating an exemplary calibration process for the read circuit involving the first target resistor having the circuit configuration of FIG. 6.

FIG. 7 is a flow diagram describing the calibration process for the first target resistor ($R_{TARGET}$) 160 having the circuit configuration shown in FIG. 6. The process begins by setting the initial resistance of the first target resistor ($R_{TARGET}$) 160 to approximately half of the maximum resistance (e.g., Input <N>="0" and others set to "1") and initializing the loop counter (i.e., p=0) at step 200. After step 200, the input pointer (k), which is used to identify the input signal to the first target resistors ($R_{TARGET}$) 160, is set to equal to N–p at step 202, where N corresponds to the last input signal (i.e., Input <N>) and may be any integer greater than 2. After step 202, the process continues to step 204, where a decision is made as to whether the pointer has reached zero. If so, the calibration process for the first target resistor ($R_{TARGET}$) 160 will be terminated. Otherwise, the process continues to step 206, where the resistance state of a population of MTJs, half of which had been previously written to $R_H$ and the other half of which had been previously written to $R_L$, is sensed using $I_{READ}$ and $I_{REF}$ as described above. The number of MTJs in the population can range from a few tens to the entire first memory array 104A. During the read process, the sense amplifier 166 will output "1" when Node D, which is connected to the positive terminal of the sense amplifier 166, has a higher voltage than Node C, which is connected to the negative terminal of the sense amplifier 166. Conversely, the sense amplifier 166 will output "0" when Node C has a higher voltage than Node D. The numbers of "1" and "0" output from the sense amplifier 166 is recorded by a counter. The loop is repeated until the input pointer, k, becomes zero. The calibration process for the balancing resistor ($R_{BAL}$) 162 and the first target resistor ($R_{TARGET}$) 160 as described above may be repeated for all memory sectors within a memory slice. Accordingly, the memory sectors within a memory slice may have different $R_{TARGET}$ resistance values.

Next, at step 208, where a decision is made as to whether the number of "0" output from the sense amplifier 166 is greater than the number of "1" output. If so, Input <k–1> of the variable transistor circuit 180 shown in FIG. 6 is set to "0" at step 210. Otherwise, the process advances to step 212, where Input <k> and Input <k–1> are set to "1" and "0", respectively. After step 210 or 212, the loop counter p is incremented by 1 at step 214, after which the process loops back to step 202 to decrement the input pointer k.

Figure 8:
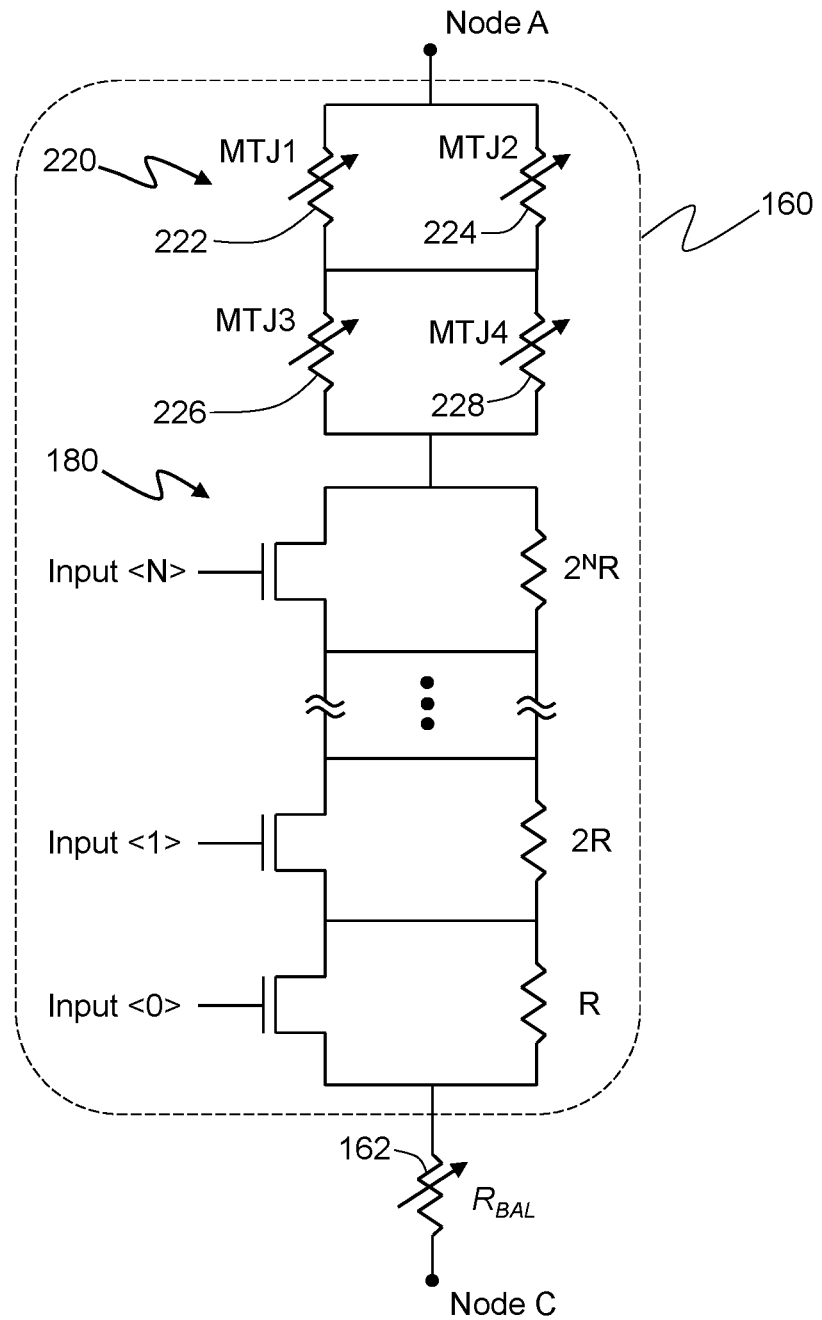
FIG. 8 is a schematic circuit diagram for another exemplary variable resistance circuit used for the first and second target resistors in the read circuit shown in FIG. 5.

FIG. 8 is a schematic circuit diagram for the first target resistor ($R_{TARGET}$) 160 in accordance with another embodiment of the present invention. Compared with the embodiment of FIG. 6, the first target resistor ($R_{TARGET}$) 160 of FIG. 8 further includes a circuit 220 connected to the variable resistance circuit 180 in series. The circuit 220 includes multiple memory elements, such as MTJs, that act as resistors. For example and without limitation, the circuit 220 may further include two sub-circuits connected in series. The first sub-circuit may include two memory elements MJT1 222 and MTJ2 224 connected in parallel. The second sub-circuit may include two other memory elements MJT3 226 and MTJ4 228 connected in parallel. The use of the circuit 220 may allow more accurate targeting of the initial value of the first target resistor ($R_{TARGET}$) 160 and the second target resistor ($R_{TARGET}$) 170 with respect to the $R_L$ and $R_H$ distributions without a priori knowledge about the electrical properties of the MTJ. For example, if the initial value is desired to be at or near the average of the $R_L$ distribution, then all MTJs 222-228 may be set to $R_L$. Conversely, if the initial value is desired to be at or near the average of the $R_H$ distribution, then all MTJs 222-228 may be set to $R_H$. Setting one of the MTJs 222 and 224 in the first sub-circuit to $R_L$ and the other one to $R_H$, and one of the MTJs 226 and 228 in the second sub-circuit to $R_L$ and the other one to $R_H$ will result in the initial value being at or near the average of the $R_L$ and $R_H$ distributions. In an embodiment, all four MTJs 222-224 are set to $R_L$ and the variable resistance circuit 180 is set to a resistance value such that the resistance of the first and second target resistors 160 and 170 falls in between the $R_L$ and $R_H$ distributions during calibration of the balancing resistor 162. Alternatively, the adjustment of the first target resistor 160 of FIG. 8, if necessary, may be similarly carried out in accordance with the flow chart of FIG. 7 with the exception that the initial resistance at step 200 is set by the MTJs 222-228 (e.g., all set to $R_L$) and all input signals to the variable resistance circuit 180 may be set to "1". The entire calibration steps 200-214 illustrated in FIG. 7 may be repeated for all memory sectors within a memory slice. Accordingly, the memory sectors within a memory slice may have different $R_{TARGET}$ resistance values.

Figure 9:
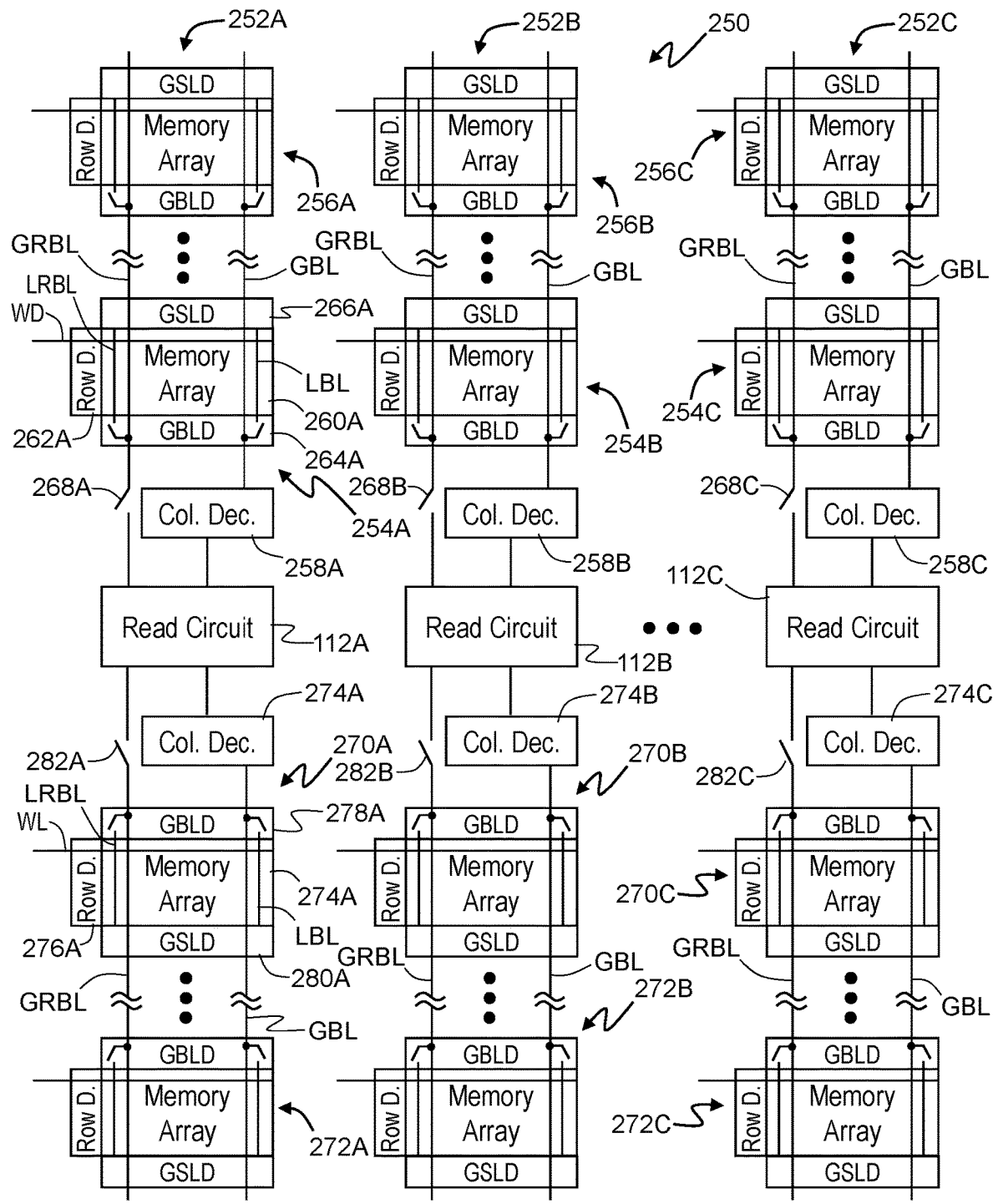
FIG. 9 is a block diagram illustrating components of a memory device in accordance with another exemplary embodiment of the present invention.

FIG. 9 is a block diagram illustrating components of a memory device 250 in accordance with another exemplary embodiment of the present invention. The memory device 250 includes a plurality of I/O or memory slices represented by memory slices 252A-252C. Each of the memory slices 252A-252C has independent input/output from other slices and may include two or more memory sectors. Each memory slice (e.g., 252A) may include a first plurality of memory sectors (e.g., 254A and 256A) connected to a first plurality of global bit lines (GBLs), which may be further connected to a read circuit (e.g., 112A) through a first column decoder (e.g., 258A). Each memory sector (e.g., 254A) includes a memory array (e.g., 260A), a row decoder (e.g., 262A) for selecting a word line (WL) traversing the memory array 260A along a first direction, a global bit line decoder (GBLD) (e.g., 264A) for connecting a local bit line (LBL) to a respective one of the first plurality of global bit lines (GBLs) traversing the first plurality of memory sectors 254A and 256A along a second direction substantially perpendicular to the first direction, and a global source line decoder (GSLD) (e.g., 266A) for connecting a local source line (not shown) to a respective one of a first plurality of global source lines (not shown) traversing the first plurality of memory sectors 254A and 256A along the second direction.

The memory array 260A is analogous to the first memory array 104A shown in FIG. 5 and includes a plurality of memory cells arranged in rows and columns (not shown), a plurality of parallel word lines (WLs), a plurality of local bit lines (LBLs), and a plurality of local source lines (not shown). The memory array 260A may also include a local reference bit line (LRBL) connected to a first global reference bit line (GRBL) through the global bit line decoder (GBLD) 264A. The first global reference bit line (GRBL) may be connected to the read circuit 112A through a first switch 268A. The first global reference bit line (GRBL) may provide a reference signal or current to the read circuit 112A when sensing the resistance state of a memory cell in the first plurality of memory sectors 254A and 256A. Other memory sectors in the first plurality of memory sectors may be substantially identical to the memory sector 254A.

Each memory slice (e.g., 252A) may further include a second plurality of memory sectors (e.g., 270A and 272A) connected to a second plurality of global bit lines (GBLs), which may be further connected to the read circuit (e.g., 112A) through a second column decoder (e.g., 273A). Like the first plurality of memory sectors 254A and 256A, each of the second plurality of memory sectors (e.g., 270A) includes a memory array (e.g., 274A), a row decoder (e.g., 276A) for selecting a word line (WL) traversing the memory array 274A along a first direction, a global bit line decoder (GBLD) (e.g., 278A) for connecting a local bit line (LBL) to a respective one of a second plurality of global bit lines (GBLs) traversing the second plurality of memory sectors 270A and 272A along a second direction substantially perpendicular to the first direction, and a global source line decoder (GSLD) (e.g., 280A) for connecting a local source line (not shown) to a respective one of a second plurality of global source lines (not shown) traversing the second plurality of memory sectors 270A and 272A along the second direction. The memory sector 270A may also include a local reference bit line (LRBL) connected to a second global reference bit line (GRBL) through the global bit line decoder (GBLD) 278A. The second global reference bit line (GRBL) traverses the second plurality of memory sectors 270A and 272A along the second direction and connects local reference bit lines of the second plurality of memory sectors 270A and 272A to the read circuit 112A via a second switch 282A. The second global reference bit line (GRBL) may provide a reference signal or current to the read circuit 112A when sensing the resistance state of a memory cell in the second plurality of memory sectors 270A and 272A. Other memory sectors in the second plurality of memory sectors may be substantially identical to the memory sector 270A. Moreover, the first and second plurality of memory sectors may be physically arranged in a mirror-image geometry on opposite sides of the read circuit 112A that acts as the mirror line.

Figure 10:
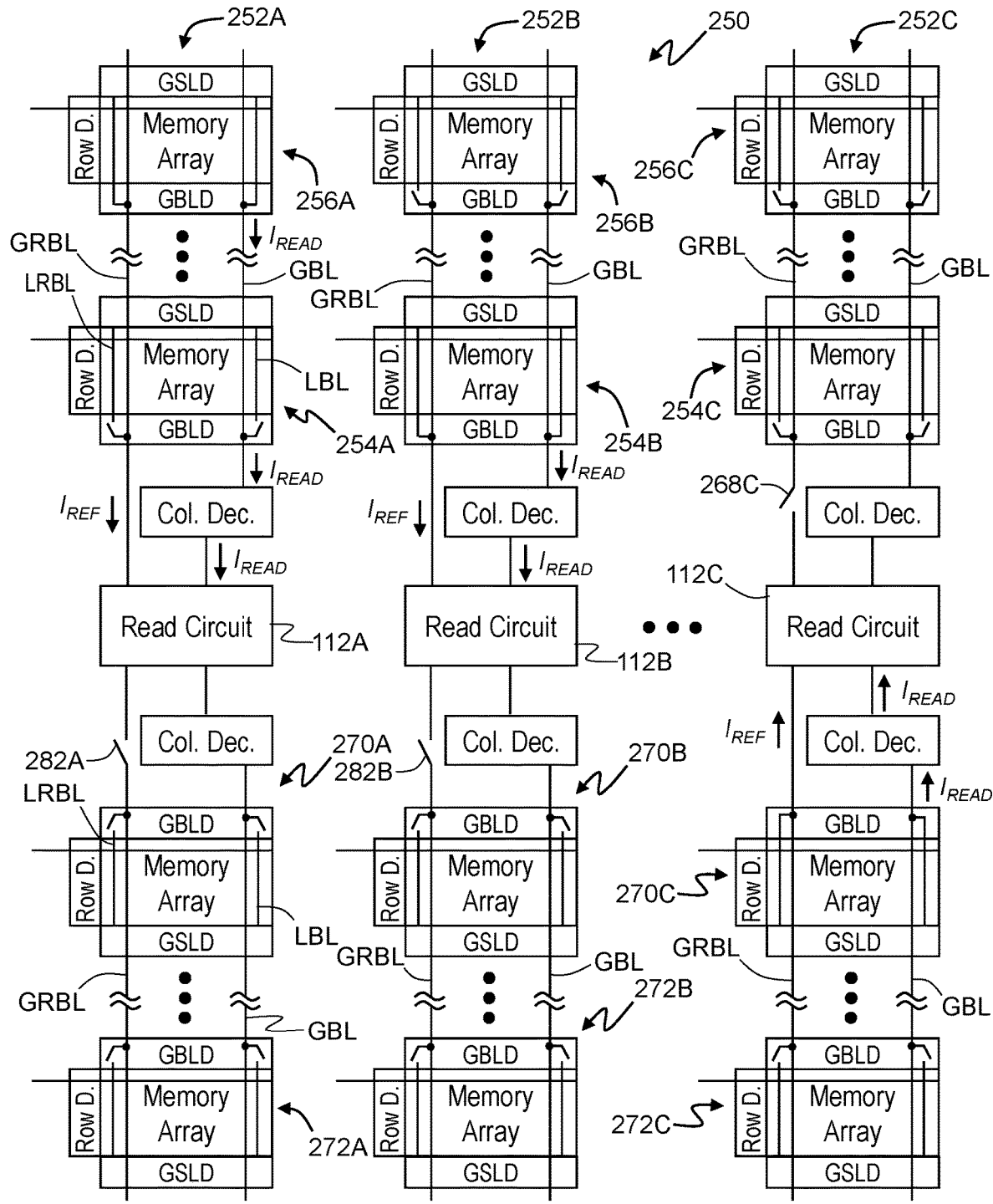
FIG. 10 is a diagram illustrating an example of the read and reference current paths for the memory device of FIG. 9 in a read operation.

Since each of the memory slices 252A-252C includes a respective one of the read circuits 112A-112C, a memory cell from each of the memory slices 252A-252C may be independently sensed at the same time. For example and without limitation, FIG. 10 shows that a memory cell from the memory sector 256A of the first memory slice 252A, another memory cell from the memory sector 254B of the second memory slice 252B, and still another memory cell from the memory sector 270C of the last memory slice 252C are simultaneously sensed. During the sensing or read operation, the read current, $I_{READ}$, passes through the memory cell selected for the read operation, the local bit line (LBL) connected to the selected memory cell, and the global bit line (GBL) connected to the local bit line (LBL), and reaches the read circuit via the first or second column decoder, while the reference current ($I_{REF}$) passes through the local reference bit line (LRBL) and the global reference bit line (GRBL) to reach the read circuit via the first or second switch.

Figure 11:
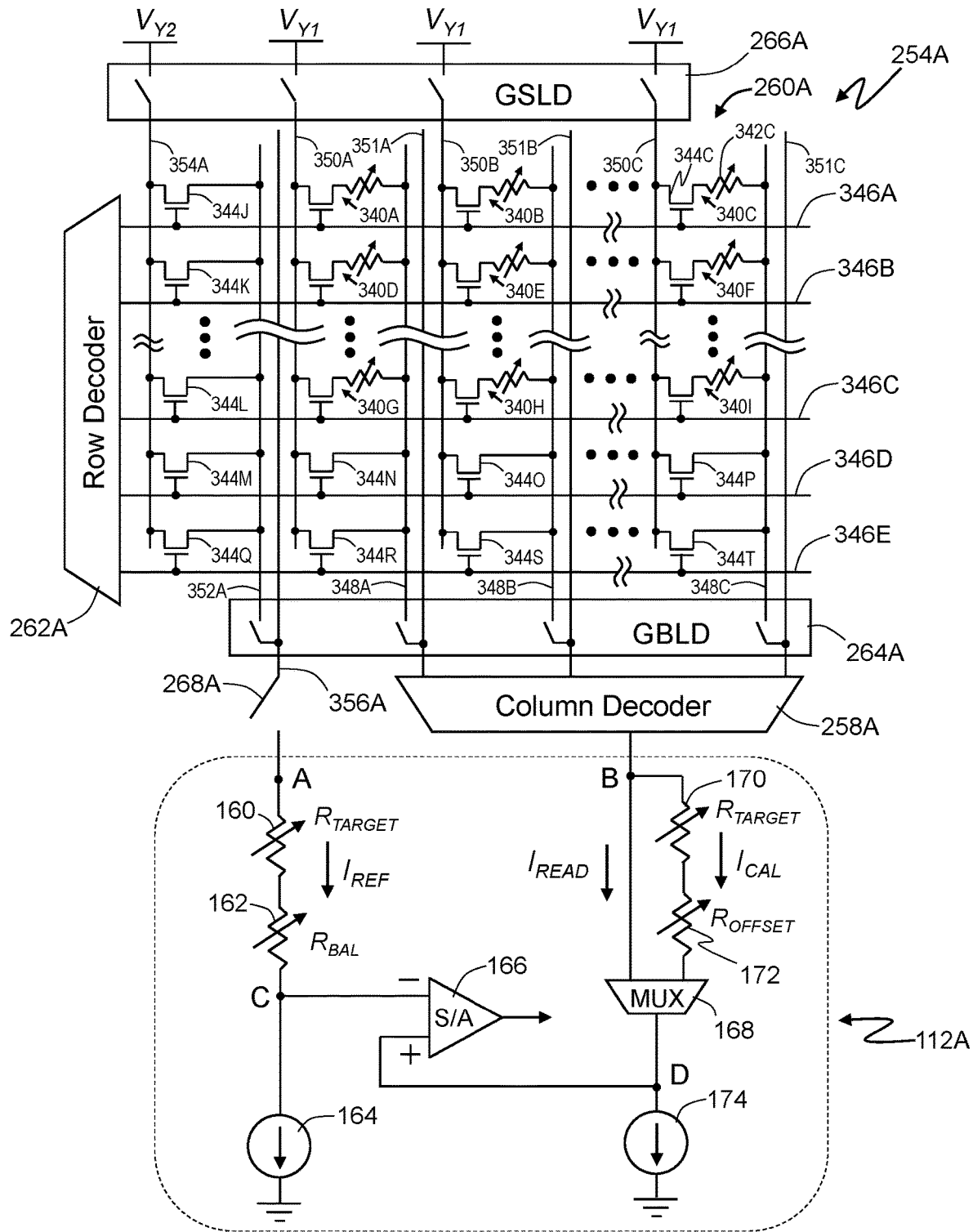
FIG. 11 is a schematic circuit diagram for a memory section and a read circuit of the memory device of FIG. 9.

FIG. 11 is schematic circuit diagram showing the memory sector 254A, the first column decoder 258A, the first switch 268A, and the read circuit 112A of the first memory slice 252A. The memory sector 254A includes the memory array 260A, the row decoder 262A, the global bit line decoder (GBLD) 264A, the global source line decoder (GSLD) 266A. The memory array 260A includes a plurality of memory cells arranged in rows and columns as represented by cells 340A-340I, a plurality of word lines represented by lines 346A-346C, a plurality of local bit lines represented by lines 348A-348C, and a plurality of local source lines represented by lines 350A-350C. Each memory cell (e.g., 340C) includes a resistance-switching memory element (e.g., 342C) and an access transistor (e.g., 344C) coupled in series between a respective one of the local bit lines (e.g., 348C) and a respective one of the local source lines (e.g., 350C). Each of the plurality of word lines 346A-346C is coupled to the gates of a respective row of the access transistors in a first direction. Each of the plurality of local bit lines 348A-348C is coupled to a respective column of the memory cells 340A-340I at one end thereof (e.g., memory element) along a second direction. Each of the plurality of local source lines 350A-350C is coupled to a respective column of the memory cells 340A-340I at the other end thereof (e.g., access transistor) along the second direction. The first and second directions may be substantially orthogonal to each other. The positions of the resistance-switching memory element (e.g., 342C) and the access transistor (e.g., 344C) in a memory cell (e.g., 340C) may be swapped such that the memory element (e.g., 342C) and the access transistor (e.g., 344C) are disposed adjacent to the local source line (e.g., 350C) and the local bit line (e.g., 348C), respectively. At the global bit line decoder (GBLD) 264A, each of the plurality of local bit lines 348A-348C may be connected to a respective one of the first plurality of global bit lines 351A-351C traversing the first plurality of memory sectors 254A and 256A along the second direction. The first plurality of global bit lines 351A-351C may be connected to the read circuit 112A at Node B through the first column decoder 258A. At the global source line decoder (GSLD) 266A, each of the plurality of local source lines 350A-350C may be connected to a respective one of the first plurality of global source lines (not shown) traversing the first plurality of memory sectors 254A and 256A along the second direction.

Each of the resistance-switching memory elements (e.g., 342C) may change the resistance state thereof by any suitable switching mechanism, such as but not limited to phase change, precipitate bridging, magnetoresistive switching, or any combination thereof. In one embodiment, the memory element 342C comprises a phase change chalcogenide compound, such as but not limited to $Ge_2Sb_2Te_5$ or AgInSbTe, which can switch between a resistive phase and a conductive phase. In another embodiment, the memory element 342C comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory element 342C comprises a magnetic free layer, a magnetic reference layer, and an insulating electron tunnel junction layer interposed therebetween, which collectively form a magnetic tunnel junction (MTJ). When a switching current is directly applied to the MTJ, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the respective layer planes.

The memory array 260A further includes a column of access transistors 344J-344L with the gate of each access transistor coupled to a respective one of the word lines 346A-346C. The column of access transistors 344J-344L, which are used to control the reference current during sensing, can be regarded as "dummy" cells without memory elements. The column of access transistors 344J-344L are coupled to a local reference bit line 352A at one of the source and drain and to a local reference source line 354A at the other one of the source and drain. The local reference bit line 352A may be connected to the first global reference bit line 356A, which in turn may be connected to the read circuit 112A at Node A through the first switch 268A. The memory array 260A may further include one or more rows of access transistors 344M-344T connected to one or more word lines 346D and 346E at the gates thereof. Each transistor of the rows of the access transistors 344M-344T is connected to a respective one of the local bit lines 348A-348C or the local reference bit line 352A at one of the source and drain and to a respective one of the local source lines 350A-350C or the local reference source line 354A at the other one of the source and drain.

All of the word lines 346A-346E may be connected to the row decoder 262A, which allows one the word line 346A-346E to be selected for read or write operation. A voltage ($V_{Y1}$) may be applied to the local source lines 350A-350C from the first plurality of global source lines (not shown) via the global source line decoder (GSLD) 266A during the read or write operation. Similarly, another voltage (e.g., $V_{Y2}$) may be applied to the local reference source line 354A from the first global reference source line (not shown) via the global source line decoder (GSLD) 266A. In an embodiment, the voltages $V_{Y1}$ and $V_{Y2}$ are set to the same voltage ($V_{READ}$) during the read operation and calibration of the read circuit 112A. The first column decoder 258A connected to the first plurality of global bit lines 351A-351C allows one of the global bit lines 351A-351C to be connected to Node B of the read circuit 112A. Likewise, the first global reference bit line 356A, which provides the reference signal in the read operation, may be connected to Node A of the read circuit 112A via the first switch 268A.

In a read operation, a read voltage (i.e., $V_{READ}$) is applied to a selected one of the first plurality of global source lines (not shown), causing a read current ($I_{READ}$) to flow from the selected global source line through the global source line decoder (GSLD) 266A, a respective one of the local source lines (e.g., 350C) connected to the selected global source line, a memory cell (e.g., 340C) connected to the local source line 350C and a selected word line (e.g., 346A), a local bit line (e.g., 348C) connected to the selected memory cell 340C, the global bit line decoder (GBLD) 264A, a respective one of the first plurality of global bit lines (e.g., 351C), and the first column decoder 258A, to Node B of the read circuit 112A. Meanwhile, a reference voltage that is substantially identical to the read voltage (e.g., $V_{READ}$) may be applied to the first global reference source line (not shown), thereby causing a reference current ($I_{REF}$) to flow from the first global reference source line through the global source line decoder (GSLD) 266A, the local reference source line 354A, one of the column of access transistors (e.g., 344J) connected to the selected word line 346A, the local reference bit line 352A, the global bit line decoder (GBLD) 264A, the first global reference bit line 356A, and the first switch 268A, to Node A of the read circuit 112A. The reference current ($I_{REF}$) does not pass through any of the memory cells (340A-340I).

In a calibration operation, a calibration voltage (i.e., $V_{READ}$) is applied to a selected one of the first plurality of global source lines (not shown), causing a calibration current ($I_{CAL}$) to flow from the selected global source line through the global source line decoder (GSLD) 266A, a respective one of the local source lines (e.g., 350C) connected to the selected global source line, an access transistor (e.g., 344P) of the rows of access transistors 344M-344T connected to the selected local source line 350C and a selected word line (e.g., 346D), a local bit line (e.g., 348C) connected to the selected access transistor 344P, the global bit line decoder (GBLD) 264A, a respective one of the first plurality of global bit lines (e.g., 351C), and the first column decoder 258A, to Node B of the read circuit 112A. Meanwhile, a reference voltage that is substantially identical to the calibration voltage (e.g., $V_{READ}$) may be applied to the first global reference source line (not shown), thereby causing a reference current ($I_{REF}$) to flow from the first global reference source line through the global source line decoder (GSLD) 266A, the local reference source line 354A, an access transistor (e.g., 344M) of the rows of access transistors 344M-344T connected to the local reference source line 354A and the selected word line 346D, the local reference bit line 352A, the global bit line decoder (GBLD) 264A, the first global reference bit line 356A, and the first switch 268A, to Node A of the read circuit 112A. Neither the calibration current ($I_{CAL}$) nor the reference current ($I_{REF}$) passes through any of the memory cells (340A-340I).

With continuing reference to FIG. 11, the read circuit 112A and operation thereof are substantially identical to the read circuit 112A and its operation shown in FIGS. 5-8 and described above.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A nonvolatile memory device comprising a plurality of memory slices, each memory slice including one or more memory sectors and a read circuit for sensing a resistance state of a magnetic memory cell in said one or more memory sectors, said read circuit comprising:

a first input node through which a reference current passes;

a second input node through which a read current and a calibration current from said one or more memory sectors pass;

a sense amplifier having first and second input terminals;

a first target resistor and a balancing resistor connected in series between said first input node and said first input terminal of said sense amplifier;

a first current source connected to said first input terminal of said sense amplifier at one end and ground at the other end;

a multiplexer having a first input terminal, a second input terminal, and an output terminal, said first input terminal of said multiplexer being connected to said second input node and having a substantially same potential as said second input node, said output terminal of said multiplexer being connected to said second input terminal of said sense amplifier;

a second target resistor and an offset resistor connected in series between said second input node and said second input terminal of said multiplexer; and a second current source connected to said output terminal of said multiplexer at one end and ground at the other end, wherein said first and second target resistors are variable resistors and have a substantially same resistance value.

2. The nonvolatile memory device of claim 1, wherein said first and second target resistors each comprise a sequence of sub-circuits connected in series with each sub-circuit including a transistor and a resistor connected in parallel, a resistance value of said resistor doubling in a successive sub-circuit.

3. The nonvolatile memory device of claim 2, wherein said first and second target resistors each further comprise first and second sub-circuits, said first and second sub-circuits each including two magnetic tunnel junctions (MTJs) coupled in parallel, said first sub-circuit, said second sub-circuit, and said sequence of sub-circuits being connected in series.

4. The nonvolatile memory device of claim 3, wherein said two magnetic tunnel junctions are in a low resistance state.

5. The nonvolatile memory device of claim 3, wherein said two magnetic tunnel junctions are in a high resistance state.

6. The nonvolatile memory device of claim 3, wherein one of said two magnetic tunnel junctions is in a low resistance state and the other one of said two magnetic tunnel junctions is in a high resistance state.

7. The nonvolatile memory device of claim 1, wherein said balancing resistor is a variable resistor.

8. The nonvolatile memory device of claim 1, wherein each of said one or more memory sectors includes a column of transistors and an array of magnetic memory cells arranged in rows and columns, each of said magnetic memory cells including an access transistor and a magnetic tunnel junction (MTJ) coupled in series between a respective one of a plurality of source lines and a respective one of a plurality of bit lines.

9. The nonvolatile memory device of claim 8, wherein said read current passes through one of said array of magnetic memory cells.

10. The nonvolatile memory device of claim 8, wherein said column of transistors are directly coupled to a reference source line at one of source and drain and a reference bit line at the other one of source and drain.

11. The nonvolatile memory device of claim 8, wherein said reference current passes through one of said column of transistors and bypasses said array of magnetic memory cells.

12. The nonvolatile memory device of claim 8, wherein said each of said one or more memory sectors further includes at least one row of transistors.

13. The nonvolatile memory device of claim 12, wherein each transistor of said at least one row of transistors is directly coupled to a respective one of said plurality of source lines at one of source and drain and a respective one of said plurality of bit lines at the other one of source and drain.

14. The nonvolatile memory device of claim 12, wherein said calibration current passes through one transistor of said at least one row of transistors and bypasses said array of magnetic memory cells.

15. A nonvolatile memory device comprising a plurality of memory slices, each memory slice including one or more memory sectors and a read circuit for sensing a resistance state of a magnetic memory cell in said one or more memory sectors, said read circuit comprising:

a first input node through which a reference current passes;

a second input node through which a calibration current passes;

a sense amplifier having first and second input terminals;

a first target resistor and a balancing resistor connected in series between said first input node and said first input terminal of said sense amplifier;

a first current source connected to said first input terminal of said sense amplifier at one end and ground at the other end;

a second target resistor connected to said second input node at one end and said second input terminal of said sense amplifier at the other end; and a second current source connected to said second input terminal of said sense amplifier at one end and ground at the other end, wherein said first and second target resistors are variable resistors and have a substantially same resistance value.

16. The nonvolatile memory device of claim 15, wherein said first and second target resistors each comprise a sequence of sub-circuits connected in series with each sub-circuit including a transistor and a resistor connected in parallel, a resistance value of said resistor doubling in a successive sub-circuit.

17. The nonvolatile memory device of claim 16, wherein said first and second target resistors each further comprise first and second sub-circuits, said first and second sub-circuits each including two magnetic tunnel junctions (MTJs) coupled in parallel, said first sub-circuit, said second sub-circuit, and said sequence of sub-circuits being connected in series.

18. The nonvolatile memory device of claim 15, wherein each of said one or more memory sectors includes a column of transistors and an array of magnetic memory cells arranged in rows and columns, each of said magnetic memory cells including an access transistor and a magnetic tunnel junction (MTJ) coupled in series between a respective one of a plurality of source lines and a respective one of a plurality of bit lines.

19. The nonvolatile memory device of claim 18, wherein said column of transistors are directly coupled to a reference source line at one of source and drain and a reference bit line at the other one of source and drain.

20. The nonvolatile memory device of claim 18, wherein said reference current passes through one of said column of transistors and bypasses said array of magnetic memory cells.

21. The nonvolatile memory device of claim 18, wherein said each of said one or more memory sectors further includes at least one row of transistors.

22. The nonvolatile memory device of claim 21, wherein each transistor of said at least one row of transistors is directly coupled to a respective one of said plurality of source lines at one of source and drain and a respective one of said plurality of bit lines at the other one of source and drain.

23. The nonvolatile memory device of claim 21, wherein said calibration current passes through one transistor of said at least one row of transistors and bypasses said array of magnetic memory cells.

\* \* \* \* \*